United States Patent
Davis

(10) Patent No.: US 9,373,375 B2
(45) Date of Patent: *Jun. 21, 2016

(54) NON-VOLATILE MEMORY VALIDITY

(71) Applicant: Lenovo (Singapore) Pte. Ltd., Singapore (SG)

(72) Inventor: Mark Charles Davis, Durham, NC (US)

(73) Assignee: Lenovo (Singapore) Pte. Ltd., Singapore (SG)

(*) Notice: Subject to any disclaimer, the term of this patent is extended or adjusted under 35 U.S.C. 154(b) by 0 days.

This patent is subject to a terminal disclaimer.

(21) Appl. No.: 14/803,266

(22) Filed: Jul. 20, 2015

(65) Prior Publication Data
US 2015/0325280 A1 Nov. 12, 2015

Related U.S. Application Data

(63) Continuation of application No. 14/089,858, filed on Nov. 26, 2013, now Pat. No. 9,087,569.

(51) Int. Cl.
*G11C 7/22* (2006.01)
*G11C 13/00* (2006.01)
*G11C 11/16* (2006.01)
*G11C 11/406* (2006.01)

(52) U.S. Cl.
CPC ............. *G11C 7/22* (2013.01); *G11C 11/1673* (2013.01); *G11C 11/1675* (2013.01); *G11C 11/1677* (2013.01); *G11C 11/1693* (2013.01); *G11C 11/406* (2013.01); *G11C 13/0033* (2013.01); *G11C 13/0035* (2013.01); *G11C 13/0061* (2013.01); *G11C 11/40615* (2013.01)

(58) Field of Classification Search
CPC .. G11C 7/22; G11C 11/1673; G11C 11/1675; G11C 11/93; G11C 11/406; G11C 11/40615; G11C 13/0033; G11C 13/0035; G11C 13/0061
USPC ........... 365/201, 185.02, 185.09, 185.25, 222
See application file for complete search history.

(56) References Cited

U.S. PATENT DOCUMENTS

| | | | | |
|---|---|---|---|---|
| 5,566,117 A | * | 10/1996 | Okamura | G11C 11/406 365/201 |
| 9,087,569 B2 | * | 7/2015 | Davis | G11C 13/0035 |
| 2010/0142276 A1 | * | 6/2010 | Kasuga | G11C 16/26 365/185.11 |

* cited by examiner

*Primary Examiner* — Tan T. Nguyen
(74) *Attorney, Agent, or Firm* — Ference & Associates LLC

(57) ABSTRACT

An embodiment provides a method, including: reading validity timing information written to a non-volatile memory device; and determining validity of the non-volatile memory device using the validity timing information read from the non-volatile memory device. Other aspects are described and claimed.

20 Claims, 5 Drawing Sheets

NON-VOLATILE MEMORY VALIDITY

CROSS REFERENCE TO RELATED APPLICATIONS

This application is a continuation application of U.S. patent application Ser. No. 14/089,858, filed on Nov. 26, 2013 and entitled "Non-Volatile Memory Validity," the contents of which are incorporated by reference herein.

BACKGROUND

Non-volatile memory devices, e.g., as used in information handling devices ("devices") such as laptops, desktops, servers, tablets, e-readers, smartphones, etc., come in a variety of forms. Non-volatile memory devices, e.g., non-volatile random access memory (NVRAM), retain information when not powered or energized. This is in contrast to volatile memory devices, e.g., random access memory (RAM), that lose information or are cleared when powered down or de-energized.

Additional types or varieties of non-volatile memory are continually developed. For example, newer types of NVRAM such as magneto-resistive random access memory (MRAM), spin transfer torque random access memory (STT-RAM), and resistive random access memory (ReRAM or RRAM) are now available. Each type of non-volatile memory has characteristics that distinguish it from other types.

BRIEF SUMMARY

In summary, one aspect provides a method, comprising: reading timing information written to a non-volatile memory device; and determining validity of the non-volatile memory device using the timing information read from the non-volatile memory device.

Another aspect provides a device, comprising: a non-volatile memory; a processor; and a memory device storing instructions executable by the processor to: read validity timing information written to the non-volatile memory device; and determine validity of the non-volatile memory device using the validity timing information read from the non-volatile memory device.

A further aspect provides a program product, comprising: a storage medium that stores instructions executable by a process, the instructions comprising: code that reads validity timing information written to a non-volatile memory device; and code that determines validity of the non-volatile memory device using the validity timing information read from the non-volatile memory device.

The foregoing is a summary and thus may contain simplifications, generalizations, and omissions of detail; consequently, those skilled in the art will appreciate that the summary is illustrative only and is not intended to be in any way limiting.

For a better understanding of the embodiments, together with other and further features and advantages thereof, reference is made to the following description, taken in conjunction with the accompanying drawings. The scope of the invention will be pointed out in the appended claims.

DETAILED DESCRIPTION

Figure 1:
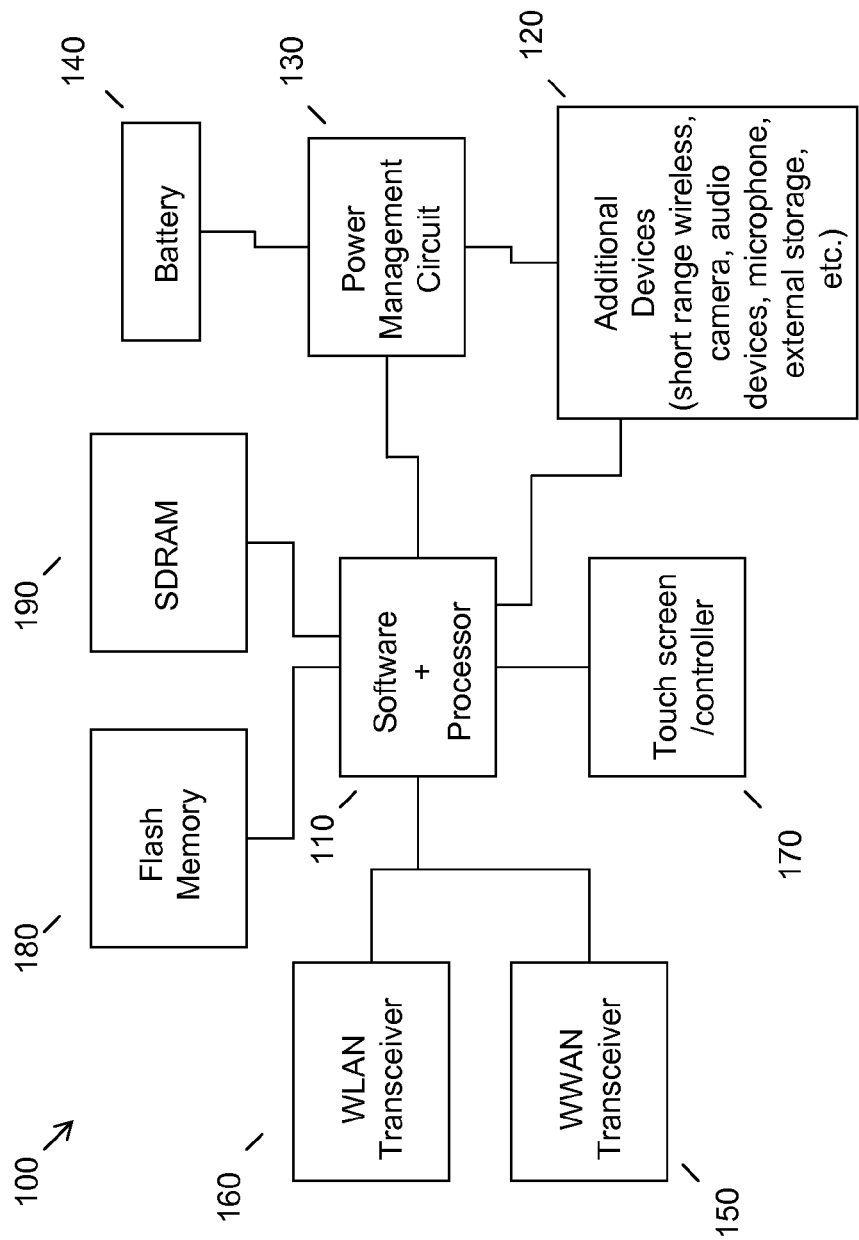
FIG. 1 illustrates an example of information handling device circuitry.

It will be readily understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the embodiments, as claimed, but is merely representative of example embodiments.

Reference throughout this specification to "one embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, et cetera. In other instances, well known structures, materials, or operations are not shown or described in detail to avoid obfuscation.

Newer types of NVRAM such as STT-RAM, MRAM, etc., have a tradeoff in that power is correlated to persistence of information retention. Thus, if these memory devices use higher power to write a bit, the bit will persist for a long time, e.g., for many years. However, if these memory devices use minimal power, the bit may only persist for a short time, e.g., a few weeks. This leads to a problem with certain devices in certain contexts. For example, for smaller/battery powered mobile devices, e.g., smart phones, tablets, etc., the portable battery powered devices battery may be depleted or removed for about the same time (or more) as the persistence of the non-volatile memory. It is desirable for devices to use the persistence of the non-volatile memory but at the same time minimize power consumed in doing so (and thus, e.g., minimizing battery use). In order for the non-volatile memory contents to be reliable, the contents are periodically read and rewritten (refreshed). This technique is used in DRAM for example, but the refresh frequency is much longer, perhaps as long as a few weeks.

An embodiment provides methods to improve the quality of persistence of such non-volatile memory technologies. For example, an embodiment determines how long the information will persist in a non-volatile memory and uses this timing information to determine refresh timing and/or predict the expected life of the non-volatile volatile memory. That is, an embodiment may leverage information regarding the non-volatile memory's ability to retain content as a predictor of the non-volatile memory's current status and its remaining useful life.

Using an embodiment, it may be determined how long since the memory has been written or refreshed (as compared to the expected life) to determine if the memory is still reliable. Depending on the determination regarding reliability, an embodiment may refresh the memory or take other actions, e.g., provide an indicator of memory reliability (or lack thereof), expect life span of the memory device, etc.

The illustrated example embodiments will be best understood by reference to the figures. The following description is intended only by way of example, and simply illustrates certain example embodiments.

While various other circuits, circuitry or components may be utilized in information handling devices, with regard to smart phone and/or tablet circuitry 100, an example illustrated in FIG. 1 includes a system on a chip design found for example in tablet or other mobile computing platforms. Software and processor(s) are combined in a single chip 110. Internal busses and the like depend on different vendors, but essentially all the peripheral devices (120) may attach to a single chip 110. The circuitry 100 combines the processor, memory control, and I/O controller hub all into a single chip 110. Also, systems 100 of this type do not typically use SATA or PCI or LPC. Common interfaces for example include SDIO and I2C.

There are power management chip(s) 130, e.g., a battery management unit, BMU, which manage power as supplied for example via a rechargeable battery 140, which may be recharged by a connection to a power source (not shown). In at least one design, a single chip, such as 110, is used to supply BIOS like functionality and DRAM memory.

System 100 typically includes one or more of a WWAN transceiver 150 and a WLAN transceiver 160 for connecting to various networks, such as telecommunications networks and wireless Internet devices, e.g., access points. Additionally, one of the additional devices 120 is commonly a short range wireless communication device, such as a BLUETOOTH radio, or element(s) that may be used for near field communications. Commonly, system 100 will include a touch screen 170 for data input and display. System 100 also typically includes various memory devices, for example flash memory 180 and SDRAM 190.

Figure 2:
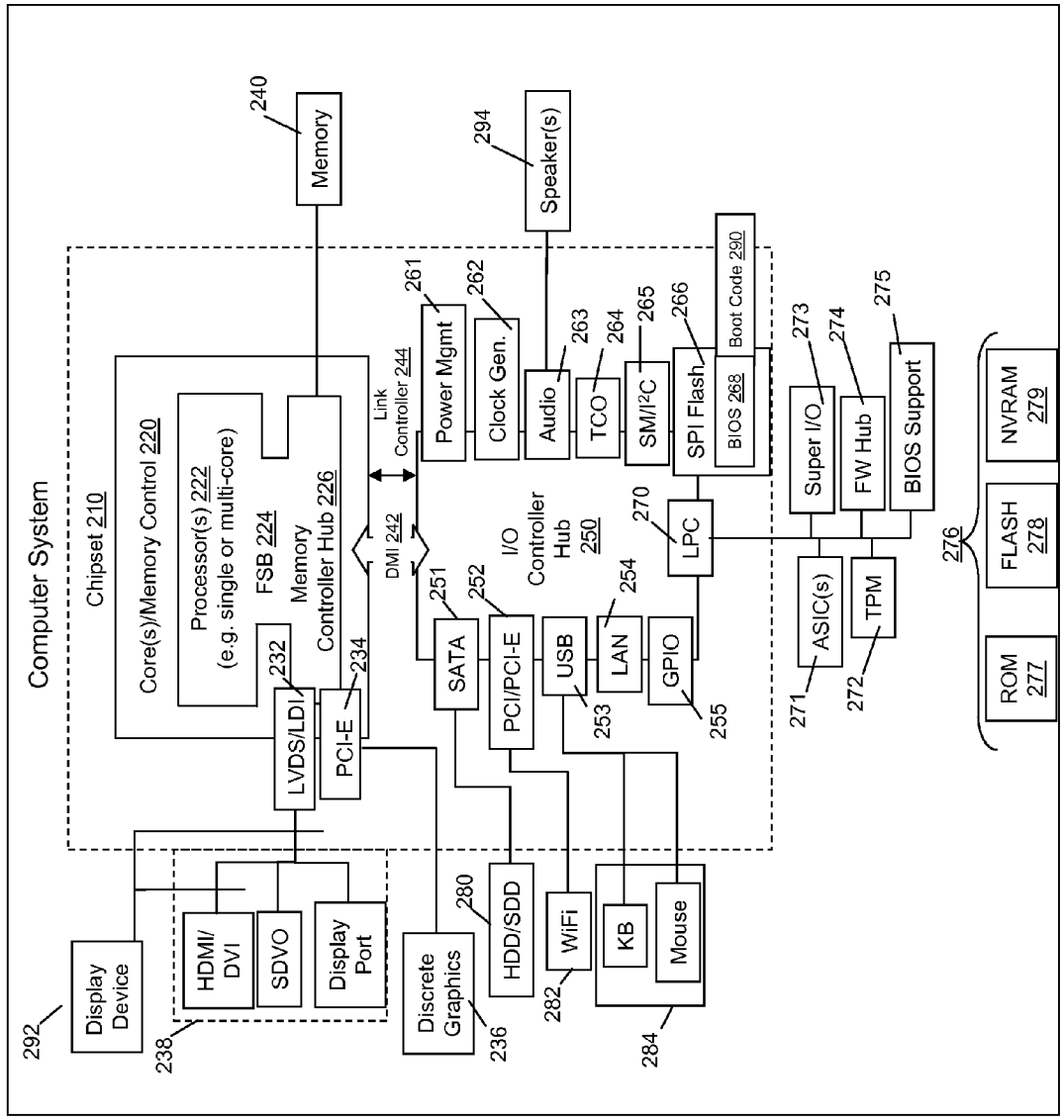
FIG. 2 illustrates another example of an information handling device.

FIG. 2, for its part, depicts a block diagram of another example of information handling device circuits, circuitry or components. The example depicted in FIG. 2 may correspond to computing systems such as the THINKPAD series of personal computers sold by Lenovo (US) Inc. of Morrisville, N.C., or other devices. As is apparent from the description herein, embodiments may include other features or only some of the features of the example illustrated in FIG. 2.

The example of FIG. 2 includes a so-called chipset 210 (a group of integrated circuits, or chips, that work together, chipsets) with an architecture that may vary depending on manufacturer (for example, INTEL, AMD, ARM, etc.). The architecture of the chipset 210 includes a core and memory control group 220 and an I/O controller hub 250 that exchanges information (for example, data, signals, commands, et cetera) via a direct management interface (DMI) 242 or a link controller 244. In FIG. 2, the DMI 242 is a chip-to-chip interface (sometimes referred to as being a link between a "northbridge" and a "southbridge"). The core and memory control group 220 include one or more processors 222 (for example, single or multi-core) and a memory controller hub 226 that exchange information via a front side bus (FSB) 224; noting that components of the group 220 may be integrated in a chip that supplants the conventional "northbridge" style architecture.

In FIG. 2, the memory controller hub 226 interfaces with memory 240 (for example, to provide support for a type of RAM that may be referred to as "system memory" or "memory"). The memory controller hub 226 further includes a LVDS interface 232 for a display device 292 (for example, a CRT, a flat panel, touch screen, et cetera). A block 238 includes some technologies that may be supported via the LVDS interface 232 (for example, serial digital video, HDMI/DVI, display port). The memory controller hub 226 also includes a PCI-express interface (PCI-E) 234 that may support discrete graphics 236.

In FIG. 2, the I/O hub controller 250 includes a SATA interface 251 (for example, for HDDs, SDDs, 280 et cetera), a PCI-E interface 252 (for example, for wireless connections 282), a USB interface 253 (for example, for devices 284 such as a digitizer, keyboard, mice, cameras, phones, microphones, storage, other connected devices, et cetera), a network interface 254 (for example, LAN), a GPIO interface 255, a LPC interface 270 (for ASICs 271, a TPM 272, a super I/O 273, a firmware hub 274, BIOS support 275 as well as various types of memory 276 such as ROM 277, Flash 278, and NVRAM 279), a power management interface 261, a clock generator interface 262, an audio interface 263 (for example, for speakers 294), a TCO interface 264, a system management bus interface 265, and SPI Flash 266, which can include BIOS 268 and boot code 290. The I/O hub controller 250 may include gigabit Ethernet support.

The system, upon power on, may be configured to execute boot code 290 for the BIOS 268, as stored within the SPI Flash 266, and thereafter processes data under the control of one or more operating systems and application software (for example, stored in system memory 240). An operating system may be stored in any of a variety of locations and accessed, for example, according to instructions of the BIOS 268. As described herein, a device may include fewer or more features than shown in the system of FIG. 2.

Information handling device circuitry, as for example outlined in FIG. 1 or FIG. 2, may be utilized in various devices according to the embodiments described herein. For example, the circuitry outlined in FIG. 1 or FIG. 2 may be utilized in a mobile or other information handling devices having a form of non-volatile memory with a limited life expectance or reliability/validity period. For example, either or both of the device circuitry outlined in FIG. 1 and the device circuitry outlined in FIG. 2 may include a non-volatile memory such as NVRAM, including but not limited to MRAM, STT-RAM, ReRAM or RRAM, etc.

Figure 3:
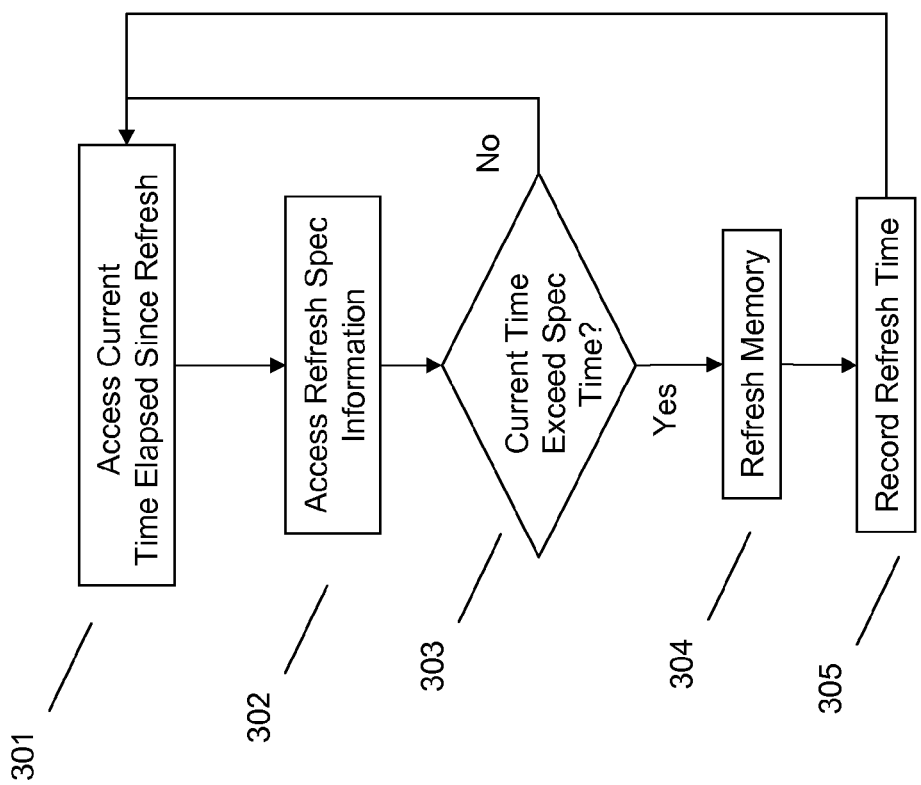
FIG. 3 illustrates an example method of determining refresh timing using validity information of a non-volatile memory.

Referring to FIG. 3, as a consequence of determining the validity of a non-volatile memory such as NVRAM, a refreshing of the NVRAM may be done according to validity information. For example, an embodiment may access information regarding a time elapsed since a last refresh of a memory (or portion thereof) at 301. This information regarding an elapsed time may be obtained in a variety of ways, as further described herein.

Having the elapsed time available, an embodiment may then access validity timing information for the memory at 302. The validity timing information may dictate the refresh policy. For example, the validity timing information may dictate that the memory is periodically refreshed, e.g., every X weeks, days, months, etc. The refresh time may be some fraction, e.g., ½ of, the validity time to insure that the refresh is done often enough. The validity timing information may be predetermined, e.g., according to an estimate given the operating characteristics of the particular memory device. For example, a memory device may be known to retain content reliably for a particular amount of time when content has been written at a given power setting, etc. Alternatively or additionally, the validity timing information may be dynamically updated or modified, e.g., as by virtue of testing the memory's ability to retain content over time. For example, a test bit or bits may be written and tracked for changes over time in order to establish the current or ongoing ability of the memory to retain content written thereto in a variety of circumstances.

Irrespective of the source of the elapsed time since refresh or the validity timing information, an embodiment may utilize these to determine if the elapsed time since refresh exceeds the validity timing information at 303, i.e., the time at which a refresh should optimally take place (which also may be referred to as refresh timing). If not, e.g., the memory has been refreshed one week ago and the validity timing information indicates that the memory contents will remain valid for six months, an embodiment may cycle back and proceed through the process at a later time, e.g., according to a policy.

Otherwise, if the time elapsed since the last refresh has exceeded the refresh timing information, an embodiment may refresh the memory at 304. The refreshing described herein may be done in a variety of ways. For example, a refresh may be done by the memory controller or by software running on the main CPU of the system. In either case, the contents of the memory are read and then written back, e.g., to the same location, at 304.

Figure 5:
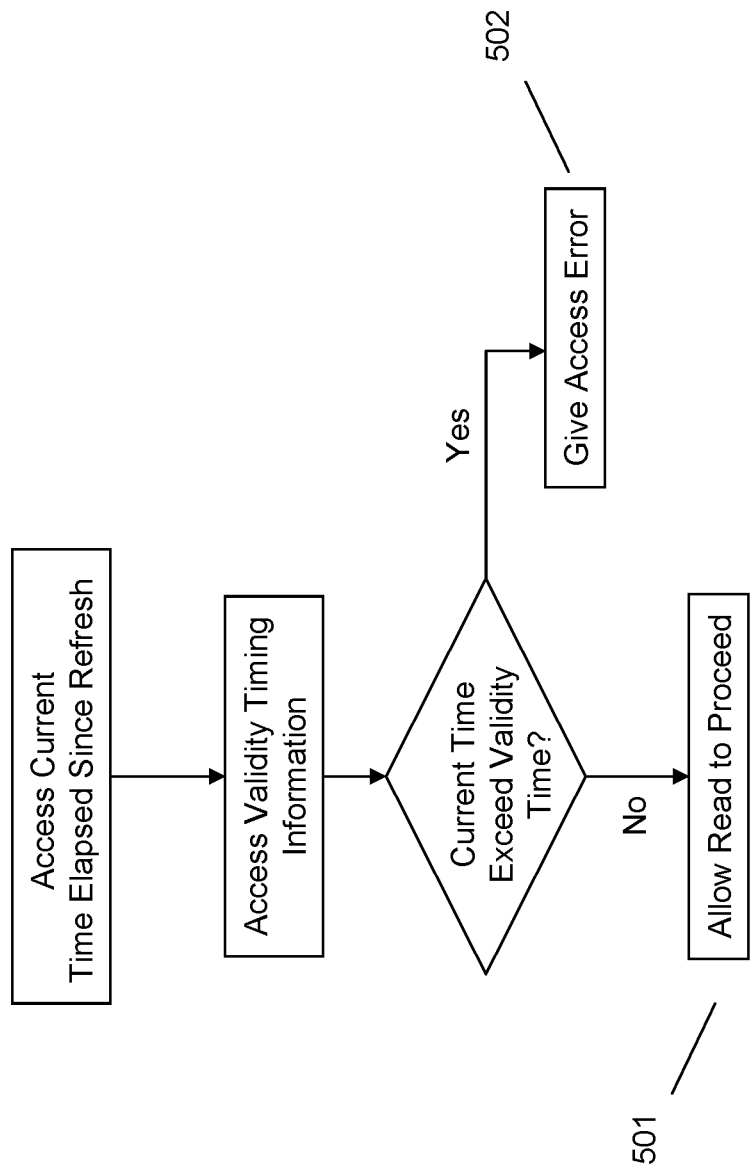
FIG. 5 illustrates an example of determining if data is still valid based on the last refresh time.

On the other hand, referring to FIG. 5, if the time period has exceeded the validity time, i.e., the refresh has not taken place soon enough, the contents of the memory may be incorrect, so the memory may signal an error condition at 502 and not provide data. If the validity time has not been exceeded in such a case, i.e., the memory has been appropriately refreshed, the memory may allow the read to proceed at 501.

In order for the memory controller (or other component or components) to later know the time of the last refresh (and therefore calculate or determine the elapsed time since refresh), a refresh time may be recorded at 305. For example, a time stamp with checksum may be recorded in a known location in the NVRAM. During normal operation, this time stamp may be periodically (for example once per hour) be updated. This time stamp may be written in a variety of ways, e.g., by the memory controller or by a separate program running on the CPU. Since the CPU and operating system (OS) are running, it may be safe to assume that the NVRAM contents are valid. Of course, it may be more efficient and accurate for the memory controller to do this, but this may require the memory controller have access to a time source. The memory controller may access a time source in a variety of ways, e.g., by getting the time directly from a real time clock, or the CPU could provide the time to the memory controller as part of reset and initialization of the system.

On reset or startup or the system, the memory controller may check this time and, using the current time, determine if the more than the expected validity time has passed since the last refresh, as illustrated in steps 301-303 of FIG. 3. If it has been too long since a last refresh, e.g., the elapsed time exceeds the validity time to an extent that the memory contents are considered not reliable; the memory controller may invalidate the memory contents, e.g., as illustrated in FIG. 5 at 502. One possibility is to clear or set to zero all of the memory locations so that the CPU can determine that no data has persisted.

Alternately, the CPU could check the time stored in the NVRAM at 305 and compare the elapsed time to the expected validity time at 303. This would require that other memory be available to the CPU, e.g., during reset, so that the NVRAM check and initialization code could be run before the NVRAM contents were known to be valid. Such a hybrid system, e.g., of DRAM and NVRAM, may be desirable for other reasons. This tends to simplify the hardware design by eliminating the need for the memory controller to have access to a time source (e.g., to know the value of the real clock time).

In addition to utilizing validity timing information to appropriately refresh and/or invalidate the contents of non-volatile memory, an embodiment may utilize validity timing information in order to estimate a lifetime expectancy of the memory device itself. For example, similar to the process of utilizing validity timing information for refresh, a memory's lifetime expectancy may be estimated in a variety of ways. Thus, lifetime expectancy may be estimated during manufacture and/or during operation. In other words, as a batch or lot of NVRAM is manufactured, it may be tested to determine the expected lifetime. A conservative estimate may then be written for example in a known location in the NVRAM.

Figure 4:
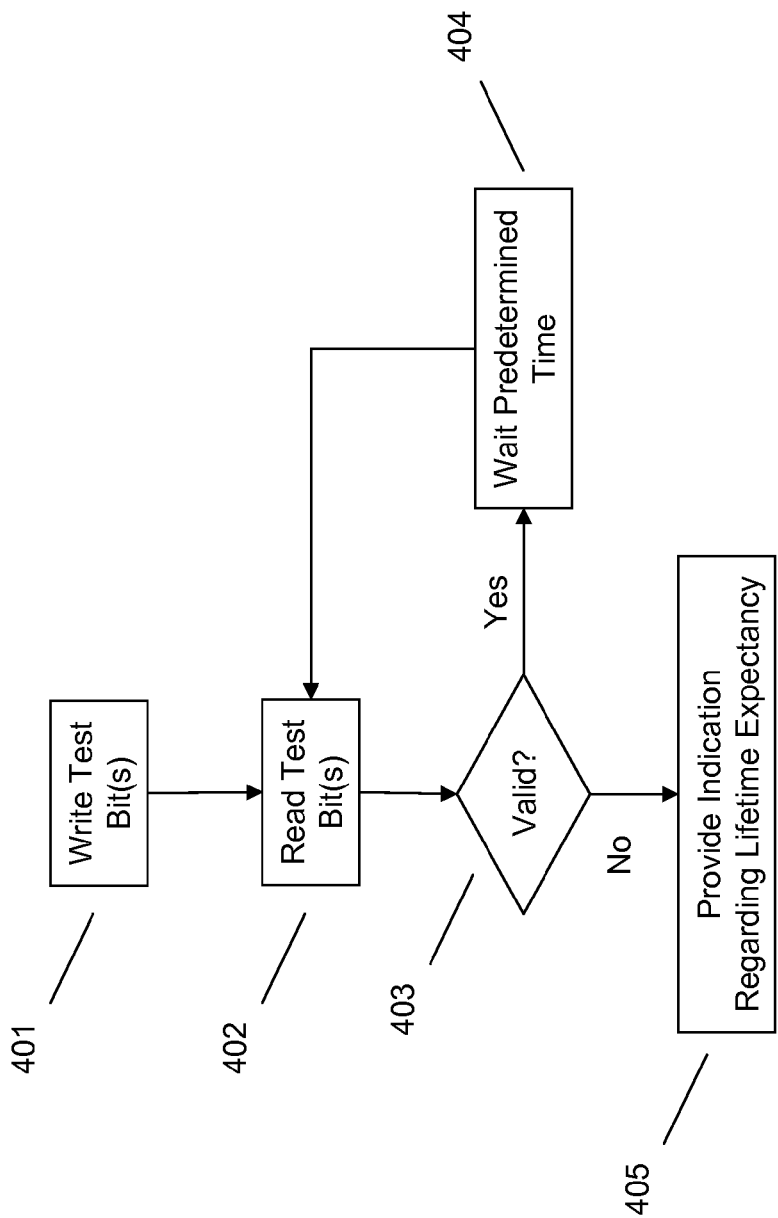
FIG. 4 illustrates an example of estimating a lifetime expectancy of a non-volatile memory using validity information of a non-volatile memory.

During operation, referring to FIG. 4, the preloaded or otherwise previously determined lifetime expectancy information, as described herein, may be updated by conducting tests. For example, in a reserved part of the memory, test bit(s) are written at 401. Thereafter, e.g., periodically or otherwise according to a policy, the test bit(s) are read at 402 and compared to expected values at 403, i.e., tested for validity to make sure the data has persisted. If the data of the test bit(s) changes, as determined at 403, then the lifetime expectancy can be calculated or estimated at 405, e.g., based on this (and like) data point(s). In an embodiment, some adjustment may be made in the estimation to make the estimate conservative. The updated expected lifetime or the original lifetime can be used in the calculations above to determine if the NVRAM contents are still valid as well.

If the contents of the memory are still valid, as determined at 403, then an embodiment may wait a predetermined time at 404 prior to re-testing at 402 and 403. In this way, an embodiment may determine if a memory is faithfully retaining data and use such information to update a lifetime expectancy estimate. For example, it is expected that a memory device that retains content for decreasing time increments will have a shorter remaining lifespan. Thus, an embodiment may provide such lifetime expectancy estimate or other indication regarding lifetime expectancy during operation of the device such that, e.g., a user may be apprised of the fact that a memory device is failing, may soon fail, etc.

Accordingly, the various embodiments described herein may be utilized to determine validity information regarding content retention of non-volatile memory devices, e.g., NVRAM, etc. Given such information, an embodiment may assist in the management of memory devices, e.g., choosing appropriate refresh rates in different contexts and/or providing updated indications regarding lifetime expectancy of a memory device.

As will be appreciated by one skilled in the art, various aspects may be embodied as a system, method or device program product. Accordingly, aspects may take the form of an entirely hardware embodiment or an embodiment including software that may all generally be referred to herein as a "circuit," "module" or "system." Furthermore, aspects may take the form of a device program product embodied in one or more device readable medium(s) having device readable program code embodied therewith.

Any combination of one or more non-signal device readable medium(s) may be utilized. The non-signal medium may be a storage medium. A storage medium may be, for example, an electronic, magnetic, optical, electromagnetic, infrared, or semiconductor system, apparatus, or device, or any suitable combination of the foregoing. More specific examples of a storage medium would include the following: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a storage medium is not a signal and "non-transitory" includes all media except signal media.

Program code embodied on a storage medium may be transmitted using any appropriate medium, including but not limited to wireless, wireline, optical fiber cable, RF, et cetera, or any suitable combination of the foregoing.

Program code for carrying out operations may be written in any combination of one or more programming languages. The program code may execute entirely on a single device, partly on a single device, as a stand-alone software package, partly on single device and partly on another device, or entirely on the other device. In some cases, the devices may be connected through any type of connection or network, including a local area network (LAN) or a wide area network (WAN), or the connection may be made through other devices (for example, through the Internet using an Internet Service Provider), through wireless connections, e.g., near-field communication, or through a hard wire connection, such as over a USB connection.

Aspects are described herein with reference to the figures, which illustrate example methods, devices and program products according to various example embodiments. It will be understood that the actions and functionality may be implemented at least in part by program instructions. These program instructions may be provided to a processor of a general purpose information handling device, a special purpose information handling device, or other programmable data processing device or information handling device to produce a machine, such that the instructions, which execute via a processor of the device implement the functions/acts specified.

As used herein, the singular "a" and "an" may be construed as including the plural "one or more" unless clearly indicated otherwise.

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable others of ordinary skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be affected therein by one skilled in the art without departing from the scope or spirit of the disclosure.

What is claimed is:

1. A method, comprising:
    reading validity timing information written to a non-volatile memory device; and
    determining validity of the non-volatile memory device using the validity timing information read from the non-volatile memory device.

2. The method of claim 1, wherein the validity timing information is predetermined.

3. The method of claim 1, wherein the validity timing information is predetermined for a memory device.

4. The method of claim 1, wherein the validity timing is predetermined for a memory device and a given power setting.

5. The method of claim 1, wherein the validity timing information is dynamically updated.

6. The method of claim 5, wherein the validity timing information is dynamically updated via:
    writing test information to the non-volatile memory device;
    waiting a predetermined time after the writing; and
    reading the test information written to the non-volatile memory device following the predetermined time.

7. The method of claim 1, further comprising determining if an elapsed time since last refresh of the non-volatile memory exceeds a threshold.

8. The method of claim 7, wherein the predetermined time is set using the validity timing information.

9. The method of claim 7, further comprising refreshing the non-volatile memory after determining that the elapsed time since last refresh of the non-volatile memory exceeds the threshold.

10. A device, comprising:
    a non-volatile memory;
    a processor; and
    a memory device storing instructions executable by the processor to:
    read validity timing information written to the non-volatile memory device; and
    determine validity of the non-volatile memory device using the validity timing information read from the non-volatile memory device.

11. The device of claim 10, wherein the validity timing information is predetermined.

12. The device of claim 10, wherein the validity timing information is predetermined for a memory device.

13. The device of claim 10, wherein the validity timing is predetermined for a memory device and a given power setting.

14. The device of claim 11, wherein the validity timing information is dynamically updated.

15. The device of claim 14, wherein the validity timing information is dynamically updated via:
    writing test information to the non-volatile memory device;
    waiting a predetermined time after the writing; and
    reading the test information written to the non-volatile memory device following the predetermined time.

16. The device of claim 10, wherein the instructions are executable by the processor to determine if an elapsed time since last refresh of the non-volatile memory exceeds a threshold.

17. The device of claim 16, wherein the predetermined time is set using the validity timing information.

18. The device of claim 16, wherein the instructions are executable by the processor to refresh the non-volatile memory after determining that the elapsed time since last refresh of the non-volatile memory exceeds the threshold.

19. The device of claim 10, wherein the non-volatile memory is non-volatile random access memory (NVRAM).

20. A program product, comprising:
    a storage medium that stores instructions executable by a process, the instructions comprising:
    code that reads validity timing information written to a non-volatile memory device; and code that determines validity of the non-volatile memory device using the validity timing information read from the non-volatile memory device.

\* \* \* \* \*